(12) United States Patent
Lubomirsky et al.

(10) Patent No.: US 6,369,493 B1
(45) Date of Patent: Apr. 9, 2002

(54) MICROWAVE PLASMA APPLICATOR HAVING A THERMAL TRANSFER MEDIUM BETWEEN A PLASMA CONTAINING TUBE AND A COOLING JACKET

(75) Inventors: Dmitry Lubomirsky, Cupertino; Harald Herchen, San Jose; Simon Yavelberg, Cupertino; David Palagashvili, Mountain View; Donald J. Olgado, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/300,182

(22) Filed: Apr. 27, 1999

(51) Int. Cl.[7] .............................. H01J 17/26; H01J 61/28
(52) U.S. Cl. ............................ 313/231.31; 315/111.21; 315/111.01; 313/231.01; 313/231.41; 118/723 MV; 118/723 ME
(58) Field of Search ................ 313/231.01–231.61, 313/11, 17, 22, 25, 26, 33, 35; 118/723 MW, 723 MP, 723 ME, 723 MR, 723 MA; 315/111.21, 111.01, 2

(56) References Cited

U.S. PATENT DOCUMENTS

| | | | | |
|---|---|---|---|---|
| 4,849,146 A | * | 7/1989 | Tanji et al. | 264/81 |
| 5,126,635 A | * | 6/1992 | Doehler et al. | 313/231.31 |
| 5,262,610 A | * | 11/1993 | Huang et al. | 219/121.43 |
| 5,439,175 A | * | 8/1995 | Okamura et al. | 118/723 MW |
| 5,747,917 A | * | 5/1998 | Herchen | 313/231.31 |
| 5,902,404 A | * | 5/1999 | Fong et al. | 313/231.31 |

* cited by examiner

Primary Examiner—Nimeshkumar D. Patel
Assistant Examiner—Mariceli Santiago
(74) Attorney, Agent, or Firm—Moser, Patterson, and Sheridan

(57) ABSTRACT

A plasma applicator having a tube that is surrounded by a cooling jacket such that a volume is defined proximate the tube. The volume is filled with a thermal transfer medium to couple heat from the tube to the cooling jacket. The cooling jacket contains an aperture through which energy is transmitted to a process gas contained in the tube. As such, the process gas is infused with energy and a plasma is formed in the tube.

18 Claims, 4 Drawing Sheets

MICROWAVE PLASMA APPLICATOR HAVING A THERMAL TRANSFER MEDIUM BETWEEN A PLASMA CONTAINING TUBE AND A COOLING JACKET

BACKGROUND OF THE INVENTION

1. Field of the Invention

The invention relates generally to semiconductor wafer processing equipment. More specifically, the invention relates to apparatus for cooling a microwave plasma applicator in a remote plasma source for a semiconductor wafer processing system.

2. Description of the Background Art

Many industrial applications utilize reactive gases and gas mixtures to process a workpiece. Such applications include the processing of semiconductor wafers during integrated circuit fabrication. A simplified depiction of a semiconductor wafer processing system 100 of the prior art is depicted in FIG. 1. The system 100 comprises a gas source 114, a remote plasma source 101, and a process chamber 102. The source 101 comprises a plasma applicator 116, a waveguide 110 and a microwave source (magnetron) 108. In the system 100, reactive gas species are produced, for example, in the plasma applicator 116 and are coupled to the processing chamber 102 wherein the semiconductor wafer W is positioned such that the wafer is exposed to the reactive gas species. Such an applicator 101 generates and sustains a plasma 105 of reactive species such as free radicals and ions. Often it is desirable to process a workpiece W with the free radicals but not the ions. In such a situation, the applicator 101 is coupled to the processing chamber by a channel or tube 104. The processing chamber 102 is generally maintained at a lower pressure than the applicator 101. Consequently, ions and free radicals tend to drift through the channel 104 towards the chamber 102. If the residence time in the channel 104 is sufficiently long, the ions will recombine before reaching the chamber 102. The free radicals, however, will enter the chamber and process the wafer W.

The plasma applicator 101 comprises a microwave transmissive tube 106 and a coaxially aligned, cylindrical cooling jacket 112. The tube 106 is connected to the microwave source, such-as a magnetron 108, by the waveguide 110. Microwaves, delivered by the waveguide 110 to the applicator 116 excite a process gas within the tube 106 to produce and sustain a plasma 105 therein. The process gas absorbs some microwave energy which heats the gas. Additional heat is generated by recombination of ionized species in the plasma 105. A substantial amount of heat is produced in the tube 106. As such, the tube 106 is surrounded by the cooling jacket 112 to remove heat generated by absorption of microwaves and plasma recombination. Such cooling is accomplished by flowing a coolant through the cooling jacket 112 that surrounds the tube 106. Specifically, the coolant flows through conduits or channels 118 formed in the cooling jacket 112.

To couple energy to the process gas, the microwaves pass through the cooling jacket, the cooling fluid and the tube. Although the cooling jacket 112 and tube 106 are fabricated from microwave transmissive material such as quartz, these elements and the coolant attenuate the microwave energy. As such, to achieve a particular plasma energy level, the magnetron must produce enough energy to overcome this attenuation.

Therefore, a need exists in the art for an a plasma applicator that is cooled in a manner that optimizes thermal transfer from the applicator while maximizing microwave energy transmission to the plasma.

SUMMARY OF THE INVENTION

The disadvantages heretofore associated with the prior art are overcome by a plasma applicator having a cooling jacket with a low absorption of electromagnetic energy. The applicator comprises a tube that is surrounded by a cooling jacket where the cooling jacket is spaced apart from the tube to define a volume between the jacket and the tube. This volume is filled with a thermal transfer medium. The thermal transfer medium transfers heat from the tube to the cooling jacket while transmitting electromagnetic radiation to the plasma.

The plasma applicator can be employed in a microwave plasma processing system to process a workpiece. The system generally comprises a processing chamber, a microwave plasma applicator and a process gas source. The process gas source is coupled to the applicator and the applicator is coupled to the processing chamber. The applicator has a microwave-transparent tube, and a cooling jacket with at least one water channel. The cooling jacket surrounds the tube such that a volume is defined between said water jacket and the tube. A thermal transfer medium fills the volume to promote heat transfer from the tube to the cooling jacket.

This invention fulfills the need for an apparatus that can effectively cool the microwave transparent tube of an applicator while transferring microwave power to the plasma with minimal absorption by the cooling jacket.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 2:
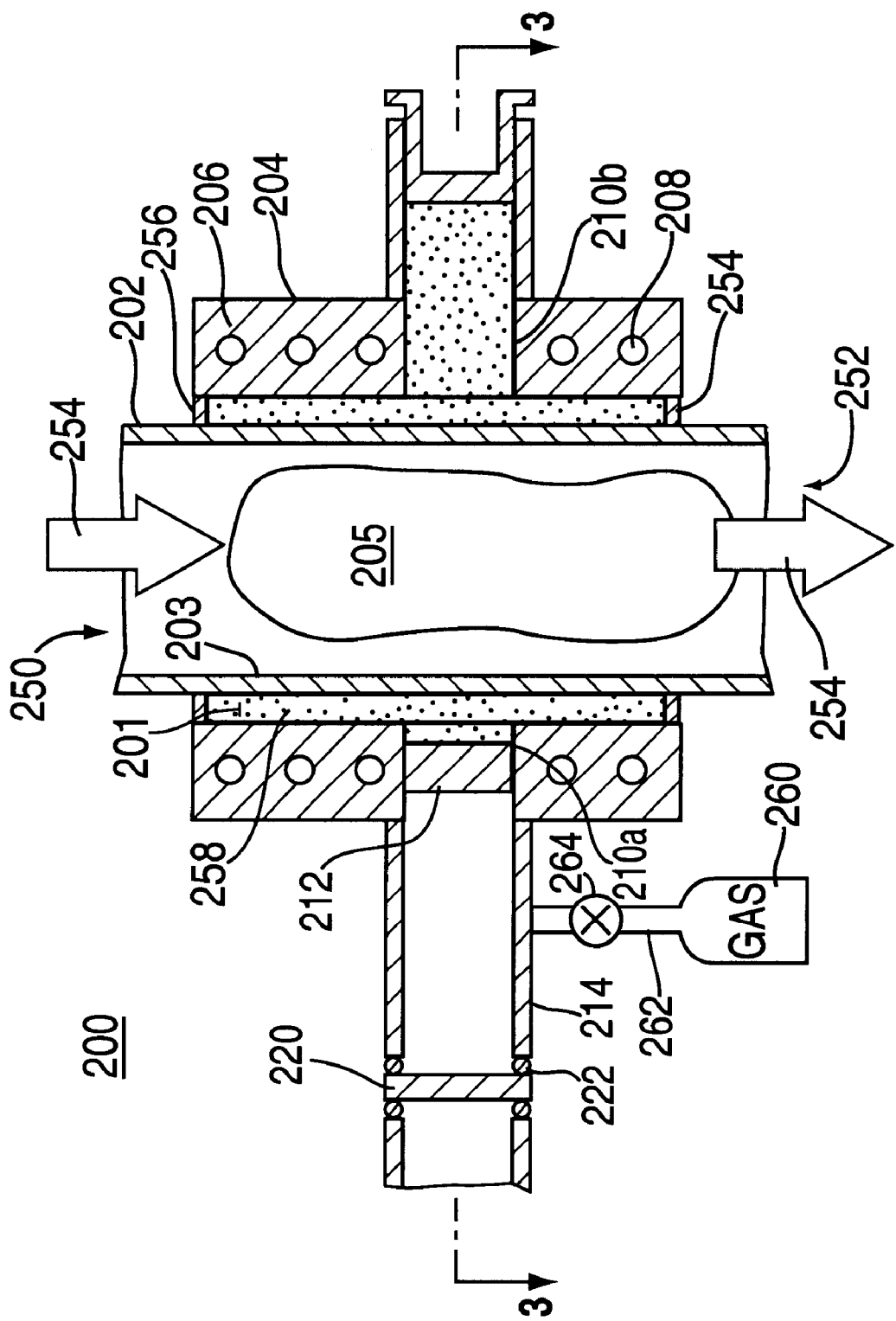
FIG. 2 depicts a vertical cross section of the microwave plasma applicator of the present invention.

FIG. 2 depicts a cross-sectional view of a microwave applicator 200 of the present invention. The applicator 200 generally comprises a cylindrical radiation transparent tube 202 that is surrounded by a cooling jacket 204. The tube 202 is generally open at both ends 250 and 252 such that a process gas is able to flow through the tube 202 in the direction indicated by the arrows 254. The tube 202 is, for example, made of quartz or similar high temperature material that is substantially transparent to electromagnetic radiation such as microwaves without substantial attenuation. A microwave signal is coupled from a microwave source (not shown) to the tube 202 by a waveguide 214. The microwave signal has a frequency selected from a range of frequencies between approximately 1 gigahertz (GHz) and 100 GHz. The specific frequency used depends on the gas to be ionized within the tube 202.

The cooling jacket 204 is coaxially aligned with the tube 202. The jacket 204 is made of a thermally conductive metal suitable for use as a wave guide, i.e., a non-ferrous metal such as copper or aluminum. The jacket 204 is generally cylindrical in shape with a thick wall 206. Although a cylindrical jacket 204 and tube 202 are described and depicted herein, those skilled in the art will be able to devise other suitable geometries for the cooling jacket 204 and tube 202. A coolant, such as water, flows through one or more channels 208 formed in the wall 206 of the jacket 204. The channels 208 are, for example, spiral in shape. Alternatively, in lieu of an embedded channel in the jacket wall, a thermally conducting tube is attached to the wall 206, to provide a cooling channel for the coolant flow.

Figure 3:
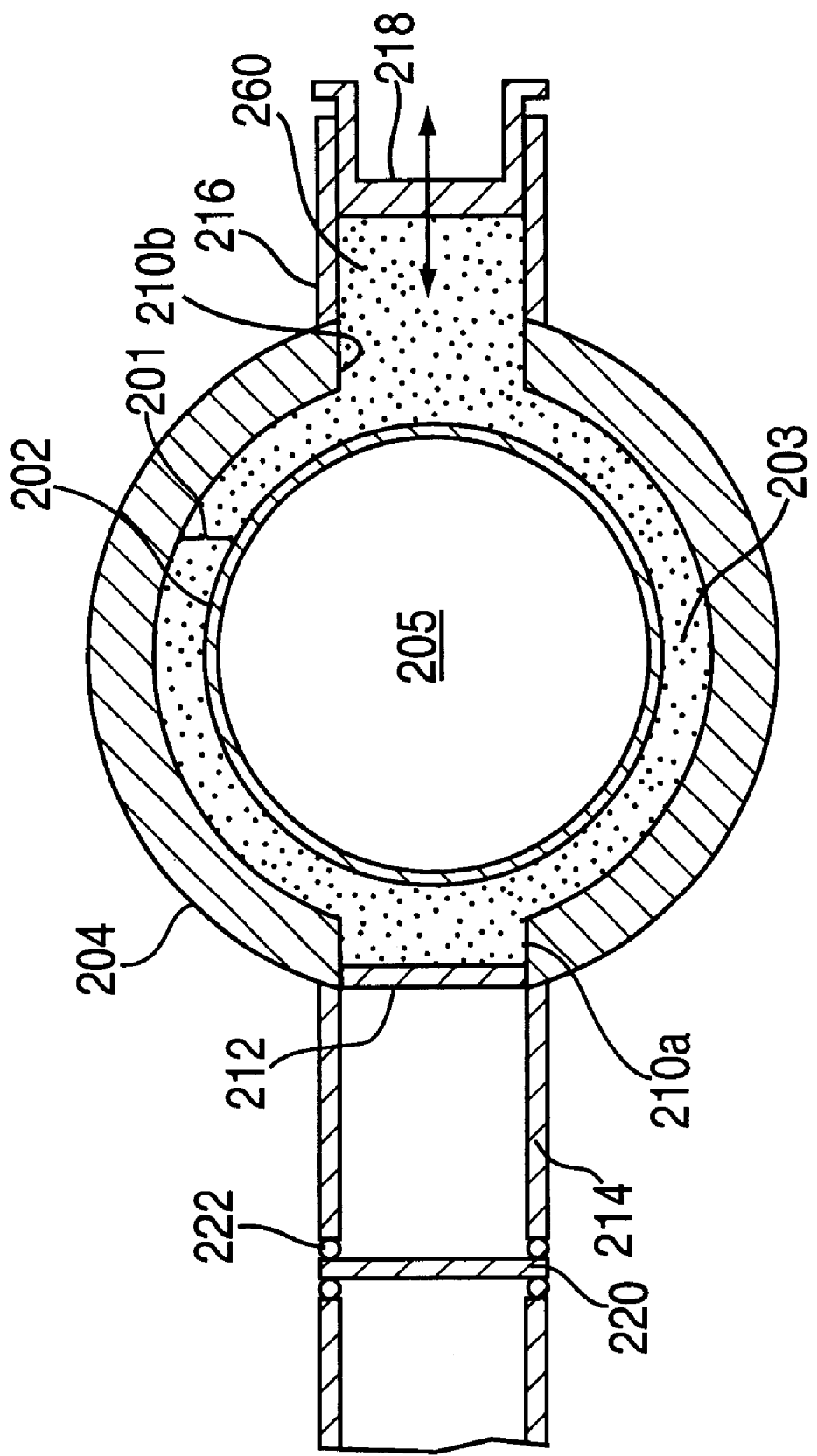
FIG. 3 depicts a horizontal cross sectional view of the microwave plasma applicator of the present invention taken along line 3—3 of FIG. 2.

As depicted in FIG. 3, the tube 202 has an outer diameter that is smaller than an inside diameter of the wall 206 of the cooling jacket 204. Thus, a thermal transfer gap 201 is defined between the wall 206 of the cooling jacket 204 and the tube 202. The cooling jacket 204 has, at each open end thereof, a first annular flange 254 and a second annular flange 256 that are each braized to the tube 202 such that a thermal transfer medium 203 gas is contained in a volume 258 surrounding the plasma generation region of the tube 202. The thermal transfer medium 203 preferably has both a low absorption of electromagnetic radiation such as microwaves and a high thermal conductivity. As such, the thermal transfer medium 203 transmits heat generated in the tube 202 to the cooling jacket 204 where it is removed by the coolant flowing in the channel 208. Additionally, the thermal transfer medium effectively couples electromagnetic radiation used to ignite and/or sustain the plasma 205 in the tube 202. The thermal transfer medium 203 can be, for example, a gas such as helium or any other suitable microwave-transparent, high thermal conductivity media.

A gas supply 260 provides heat transfer gas to the volume 258 via a gas line 262 and valve 264. The volume 258 is pressurized, e.g., by opening the valve 264. After the volume 258 is pressurized, the valve 262 is closed. When a gas, such as helium, is used as the thermal transfer medium 203 the gas pressure in volume 258 is preferably kept above saturation threshold to prevent plasma ignition in the volume. The saturation threshold, determined by the well known Paschen curve, depends on the gas pressure in the volume 258 and the width of the gap 201. For example, a gap 201 having a width of approximately 3 microns has a minimum saturation threshold at a pressure of about 60 pounds per square inch for argon.

The wall 206 of the cooling jacket 204 contains a pair of rectangular apertures 210a and 210b located on opposite sides of the jacket 204. Electromagnetic radiation from a remote source (not shown) is delivered to the plasma 205 through the aperture 210a via a suitable conduit such as a waveguide 214. A window 212 transmits radiation through the aperture 210a and into the tube 202. Preferably, the window absorbs a minimal amount of radiant energy to maximize the power transmitted to the plasma 205 in the tube 202. In addition, since the window 212 is not actively cooled, heat is passively transferred from the window 212 to the cooling jacket 204 by conduction. The window 212 is therefore preferably in good thermal contact with cooling jacket 204 (e.g., press fit into the aperture 210a) and made of a material having a low absorption coefficient for radiation as well as a high thermal conductivity. If the radiation is in the form of microwaves, a suitable material is, for example, pyrolitic boron nitride (PBN). The thermal conductivity of pyrolitic boron nitride is directionally dependent. For example, the thermal conductivity is approximately 250 Watts/meter in a direction parallel to a certain crystal axis (vertical axis in FIG. 2) and approximately 40–50 Watts/meter in a direction perpendicular to the axis (horizontal axis in FIG. 2). As such, heat is effectively transferred from the window 210 into the cooling jacket 204. The window 212 need not necessarily form a seal with the cooling jacket 204 to confine the thermal transfer medium 203 within the volume 258. The thermal transfer medium 203 is confined, for example, by the combination of a quartz plate 220 and a seal 222 such as a gasket or o-ring that are positioned in the waveguide 214. By positioning the O-rings a distance from the applicator, the O-rings do not need to withstand a high temperature.

To effectively couple microwave energy to the process gas, a standing wave is established in the tube 202. To this end, the cooling jacket 204 incorporates a tunable microwave cavity located opposite from the waveguide 214. Such a cavity 260 comprises, for example, a short section of waveguide 216 attached to the cooling jacket 204 at the second aperture 210b. A plunger 218, movably disposed for translation in the waveguide 216, adjusts the length of the cavity 260 to establish a standing wave in the tube 202.

Figure 4:
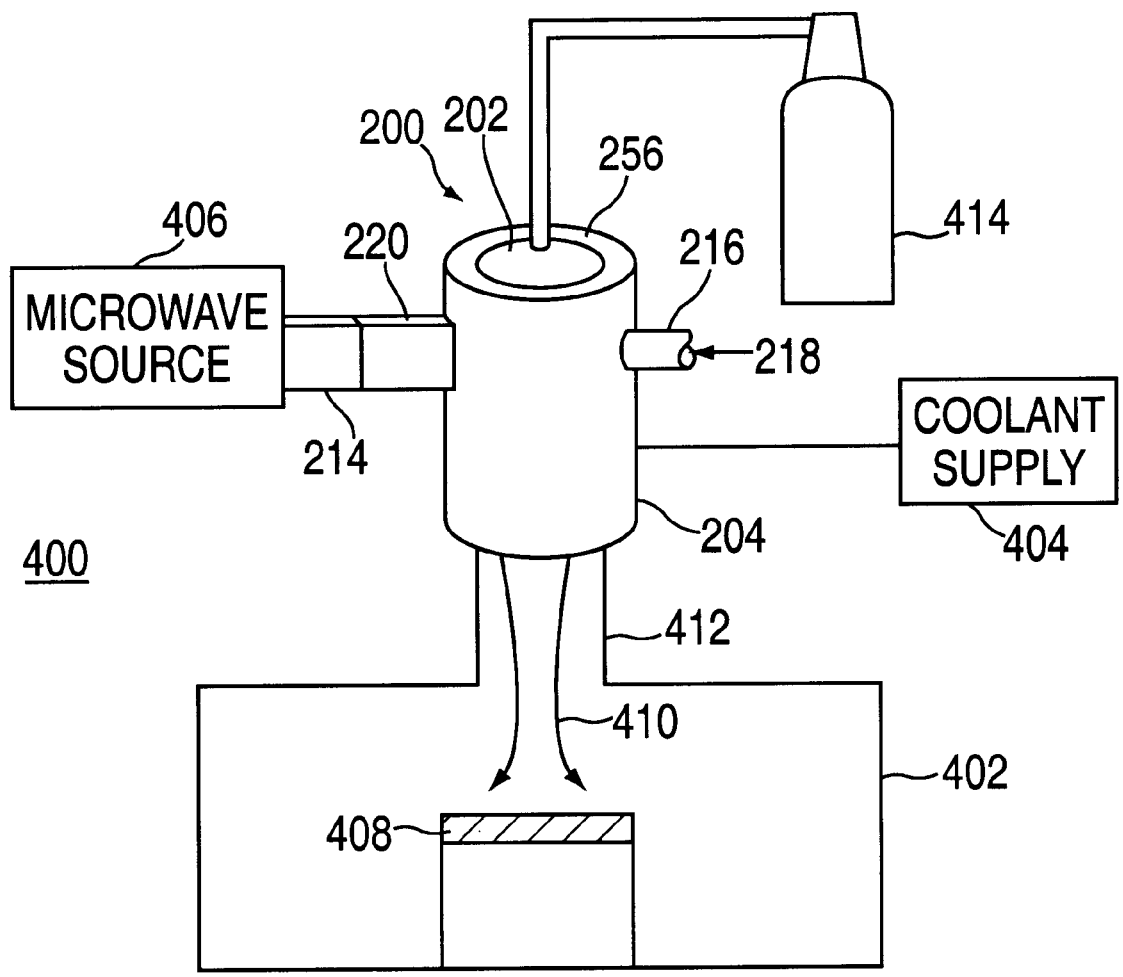
FIG. 4 depicts a plasma processing system of the present invention.
Figure 1:
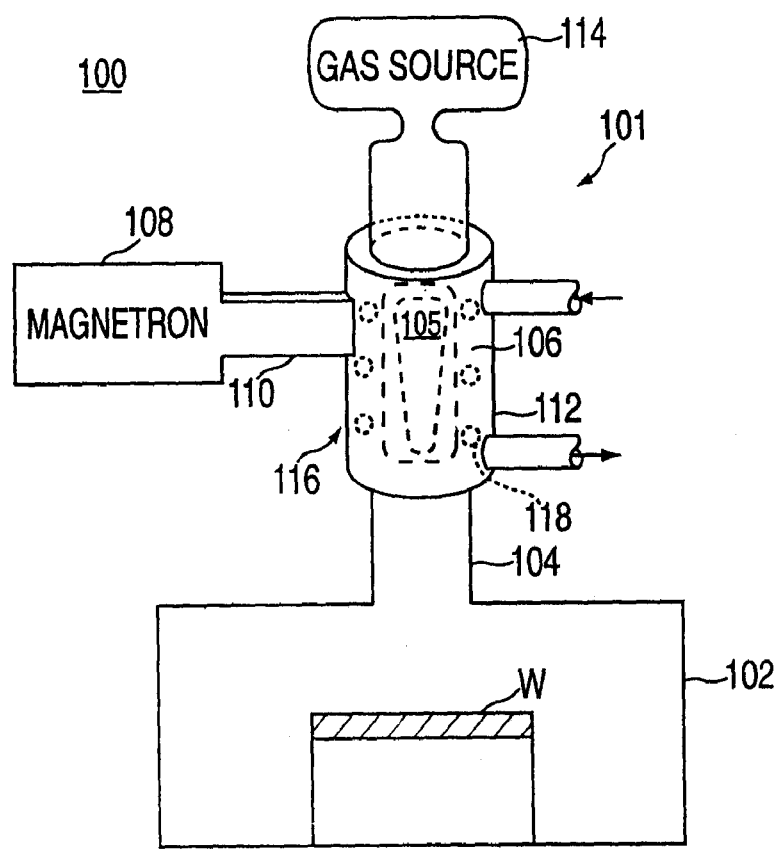

The plasma applicator 200 of the present invention can be utilized with a processing system 400 such as that depicted in FIG. 4. The system 400 generally comprises a process chamber 402, an applicator 200, a microwave source 406, a coolant source 404 and a gas source 414. The chamber 402 is, for example, an Advanced Strip and Passivation (ASP) chamber manufactured by Applied Materials, Inc. of Santa Clara, Calif. The microwave plasma applicator 200 is coupled to the chamber 402 by a channel 412. The process gas source 414 provides a process gas to the applicator 200 wherein the gas is infused with energy to produce a plasma within the applicator 200. A microwave source 406 is coupled to the applicator by a waveguide 214 to provide microwave energy to the process gas within the applicator 200.

The system 400 is generally used to process a workpiece, such as semiconductor wafer 412, by exposing the wafer 412 to reactive species that are generated by the plasma applicator 200. The species generally flow from the applicator 200 toward the wafer 412 along the path represented by arrows 410. Such processes include, but are not limited to, any isotropic etch, metal etch, photoresist strip, and passivation. Although the present invention is described in terms of a microwave plasma applicator, the invention could be used in a plasma applicator that uses a different frequency range of the electromagnetic spectrum such as radio frequency (RF) radiation to ignite and sustain a plasma.

Although various embodiments which incorporate the teachings of the present invention have been shown and described in detail herein, those skilled in the art can readily devise many other varied embodiments that still incorporate these teachings.

What is claimed is:

1. A plasma applicator comprising:
    a tube for containing a plasma;
    a cooling jacket circumscribing the tube and being spaced apart from the tube to define a volume around said tube; and
    a thermal transfer gas residing in said volume to conduct heat from the tube to the cooling jacket.

2. The plasma applicator of claim 1 wherein said tube is fabricated of a material that is substantially transparent to microwave radiation.

3. The plasma applicator of claim 1 wherein said thermal transfer gas is helium.

4. The plasma applicator of claim 1 further comprising a substantially radiation-transparent window, disposed in a first aperture in said cooling jacket.

5. The plasma applicator of claim 4 wherein said substantially radiation-transparent window is made of a thermally conductive material.

6. The plasma applicator of claim 5 wherein said thermally conductive material is pyrolitic boron nitride.

7. The plasma applicator of claim 1 further comprising a tuning stub coupled to said cooling jacket.

8. A plasma processing system, comprising:

a process chamber;

a plasma applicator, coupled to said process chamber, said applicator having a tube for containing plasma and a cooling jacket, said cooling jacket circumscribing the tube and being spaced apart from the tube to define a volume around said tube that contains a thermal transfer gas that conducts heat from the tube to the cooling jacket;

a gas source coupled to said tube; and an energy source coupled to said plasma applicator.

9. The plasma processing system of claim 8 wherein said tube is substantially transparent to energy from said energy source.

10. The plasma processing system of claim 9 wherein said energy source produces microwave energy.

11. The plasma processing system of claim 8 wherein said source of energy is a microwave source.

12. The plasma processing system of claim 8 wherein said tube is fabricated of a material that is substantially transparent to microwave radiation.

13. The plasma processing system of claim 8 where said thermal transfer gas is helium.

14. The plasma processing system of claim 8 further comprising a substantially radiation-transparent window, disposed in a first aperture in said jacket.

15. The plasma processing system of claim 14 wherein said substantially radiation-transparent window, is made of a thermally conductive material.

16. The plasma processing system of claim 15 wherein said thermally conductive material is pyrolitic boron nitride.

17. The plasma processing system of claim 8, further comprising a tuning stub coupled to said cooling jacket.

18. A plasma applicator, comprising:

a tube for containing a plasma;

a cooling jacket circumscribing the tube and spaced apart from the tube to define a volume around said tube; and a thermal transfer medium residing in said volume wherein the thermal transfer medium is a gas that conducts heat from the tube to the cooling jacket;

a substantially radiation-transparent window, disposed in a first aperture in said cooling jacket, wherein said window is made of pyrolitic boron nitride; and a tuning stub coupled to said cooling jacket.

\* \* \* \* \*

UNITED STATES PATENT AND TRADEMARK OFFICE
CERTIFICATE OF CORRECTION

PATENT NO.     : 6,369,493 B1
DATED          : April 9, 2002
INVENTOR(S)    : Lubomirsky et al.

Figure 1:
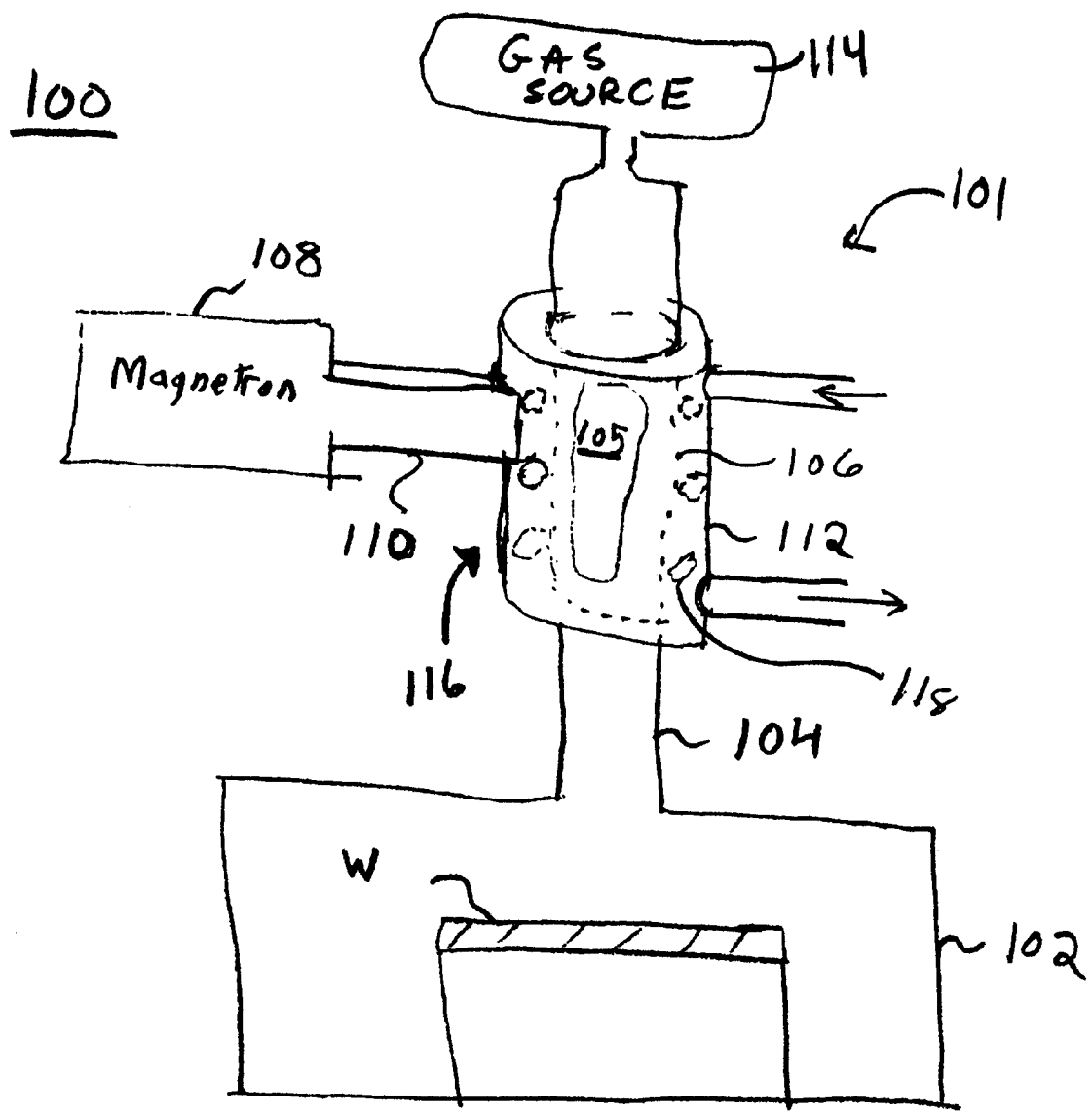
FIG. 1 depicts a prior art plasma processing system.

It is certified that error appears in the above-identified patent and that said Letters Patent is hereby corrected as shown below:

Drawings,
Please replace the informal Figure 1 with the formal version of Figure 1 submitted on September 12, 2001 and attached hereto.

Signed and Sealed this

Thirteenth Day of August, 2002

Attest:

Attesting Officer

JAMES E. ROGAN
Director of the United States Patent and Trademark Office